(12) United States Patent
Yang et al.

(10) Patent No.: US 11,631,766 B2
(45) Date of Patent: Apr. 18, 2023

(54) SEMICONDUCTOR DEVICE

(71) Applicant: UNITED MICROELECTRONICS CORP., Hsin-Chu (TW)

(72) Inventors: Cheng-Hua Yang, Hsinchu (TW);
Chih-Chien Chang, Hsinchu (TW);
Shen-De Wang, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 36 days.

(21) Appl. No.: 17/227,392

(22) Filed: Apr. 12, 2021

(65) Prior Publication Data
US 2022/0310839 A1 Sep. 29, 2022

(30) Foreign Application Priority Data
Mar. 29, 2021 (TW) .................................. 110111277

(51) Int. Cl.
*H01L 29/78* (2006.01)
*H01L 29/10* (2006.01)
*H01L 29/40* (2006.01)
*H01L 29/423* (2006.01)

(52) U.S. Cl.
CPC ...... *H01L 29/7816* (2013.01); *H01L 29/1095* (2013.01); *H01L 29/402* (2013.01); *H01L 29/42368* (2013.01)

(58) Field of Classification Search
CPC . H01L 29/06; H01L 29/0653; H01L 29/0696; H01L 29/10; H01L 29/1095; H01L 29/40; H01L 29/402; H01L 29/42; H01L 29/42368; H01L 29/78; H01L 29/7816

USPC ......................................................... 257/339
See application file for complete search history.

(56) References Cited

U.S. PATENT DOCUMENTS

| 9,595,590 | B2 | 3/2017 | Ryu | |
|---|---|---|---|---|
| 10,381,460 | B2 | 8/2019 | Ryu | |
| 2009/0230468 | A1* | 9/2009 | Cai | ..................... H01L 29/7816 257/337 |
| 2012/0228704 | A1* | 9/2012 | Ju | ..................... H01L 29/66689 257/E29.256 |
| 2014/0131796 | A1* | 5/2014 | Zhou | ................. H01L 29/66681 438/286 |
| 2019/0259830 | A1* | 8/2019 | Parthasarathy | ..... H01L 29/0634 |
| 2019/0288112 | A1 | 9/2019 | Wang | |
| 2019/0386134 | A1* | 12/2019 | Kim | ..................... H01L 29/1045 |

(Continued)

*Primary Examiner* — Fazli Erdem
(74) *Attorney, Agent, or Firm* — Winston Hsu

(57) ABSTRACT

A semiconductor device includes a semiconductor substrate, a gate structure, a source region, a drain region, a first oxide layer, a field plate, and a second oxide layer. The gate structure is disposed on the semiconductor substrate. The source region and the drain region are disposed in the semiconductor substrate and located at two opposite sides of the gate structure respectively. The first oxide layer includes a first portion disposed between the gate structure and the semiconductor substrate and a second portion disposed between the gate structure and the drain region. The field plate is partly disposed above the gate structure and partly disposed above the second portion of the first oxide layer. The second oxide layer includes a first portion disposed between the field plate and the gate structure and a second portion disposed between the field plate and the second portion of the first oxide layer.

19 Claims, 8 Drawing Sheets

(56) References Cited

U.S. PATENT DOCUMENTS

2020/0091340 A1\* 3/2020 Snyder ................ H01L 29/0878
2021/0296451 A1\* 9/2021 Chen .................... H01L 29/402

\* cited by examiner

SEMICONDUCTOR DEVICE

BACKGROUND OF THE INVENTION

1. Field of the Invention

The present invention relates to a semiconductor device, and more particularly, to a semiconductor device including oxide layers.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency band power amplifier. The essential feature of LDMOS transistor device is a lateral-diffused drift region with low doping concentration and large area. The drift region is used to alleviate the high voltage between the drain and the source, and therefore LDMOS transistor device can have higher breakdown voltage. However, as the requirements of related products become higher and higher, how to improve the electrical performance, the voltage endurance, and/or on-resistance (Ron) of power devices through design modifications in the structure and/or process is still a continuous issue for those in the related fields.

SUMMARY OF THE INVENTION

A semiconductor device is provided in the present invention. A first oxide layer and a second oxide layer are disposed under a gate structure and disposed above the gate structure respectively for reducing on-resistance (Ron) of the semiconductor device and/or modifying electric field distribution.

According to an embodiment of the present invention, a semiconductor device is provided. The semiconductor device includes a semiconductor substrate, a gate structure, a source region, a drain region, a first oxide layer, a field plate, and a second oxide layer. The gate structure is disposed on the semiconductor substrate. The source region and the drain region are disposed in the semiconductor substrate and located at two opposite sides of the gate structure in a horizontal direction, respectively. The first oxide layer includes a first portion and a second portion. The first portion of the first oxide layer is disposed between the gate structure and the semiconductor substrate in a vertical direction, and the second portion of the first oxide layer is disposed between the gate structure and the drain region. The field plate is partly disposed above the gate structure and partly disposed above the second portion of the first oxide layer. The second oxide layer includes a first portion and a second portion. The first portion of the second oxide layer is disposed between the field plate and the gate structure in the vertical direction, and the second portion of the second oxide layer is disposed between the field plate and the second portion of the first oxide layer in the vertical direction.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
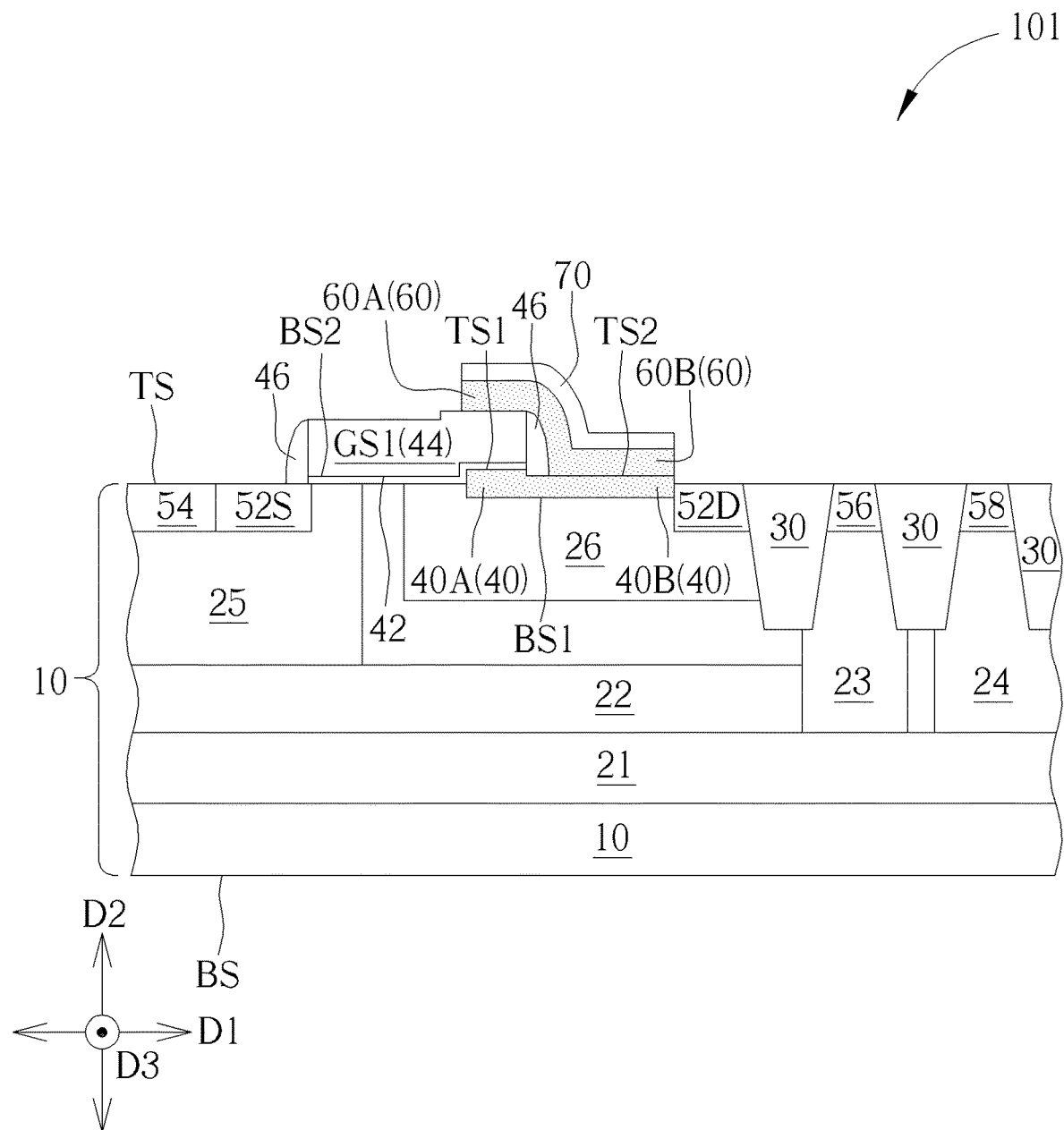
FIG. 1 is a schematic drawing illustrating a semiconductor device according to a first embodiment of the present invention.

Please refer to FIG. 1. FIG. 1 is a schematic drawing illustrating a semiconductor device 101 according to a first embodiment of the present invention. As shown in FIG. 1, the semiconductor device 101 is provided in this embodiment, and the semiconductor device 101 includes a semiconductor substrate 10, a gate structure 44, a source region 52S, a drain region 52D, a first oxide layer 40, a field plate 70, and a second oxide layer 60. The gate structure 44 is disposed on the semiconductor substrate 10. The source region 52S and the drain region 52D are disposed in the semiconductor substrate 10 and located at two opposite sides of the gate structure 44 in a horizontal direction (such as a first direction D1 shown in FIG. 1), respectively. The first oxide layer 40 includes a first portion 40A and a second portion 40B. The first portion 40A of the first oxide layer 40 is disposed between the gate structure 44 and the semiconductor substrate 10 in a vertical direction (such as a second direction D2 shown in FIG. 1), and the second portion 40B of the first oxide layer 40 is disposed between the gate structure 44 and the drain region 52D. The field plate 70 is partly disposed above the gate structure 44 and partly disposed above the second portion 40B of the first oxide layer 40. The second oxide layer 60 includes a first portion 60A and a second portion 60B. The first portion 60A of the second oxide layer 60 is disposed between the field plate 70 and the gate structure 44 in the vertical direction (such as the second direction D2), and the second portion 60B of the second oxide layer 60 is disposed between the field plate 70 and the second portion 40B of the first oxide layer 40 in the second direction D2. By disposing the first oxide layer 40, the second oxide layer 60, and the field plate 70 described above, the on-resistance (Ron) of the semiconductor device 101 may be reduced and/or the electric field distribution may be modified for improving related electrical performance of the semiconductor device 101.

In some embodiments, the first direction D1 described above may be substantially orthogonal to another horizontal direction (such as a third direction shown in FIG. 1) and the second direction D2 described above, and the second direction D2 may be regarded as a thickness direction of the semiconductor substrate 10. The semiconductor substrate 10 may have a top surface TS and a bottom surface BS opposite to the top surface TS in the second direction D2, and the gate structure 44, the first oxide layer 40, the field plate 70, and the second oxide layer 60 may be disposed at a side of the top surface TS. The first direction D1 and the third direction D3 may be substantially parallel with the top surface TS of the semiconductor substrate 10 and/or the bottom surface BS of the semiconductor substrate 10, but not limited thereto. Additionally, in this description, a distance between the bottom surface BS of the semiconductor substrate 10 and a relatively higher location and/or a relatively higher part in the vertical direction (such as the second direction D2) is greater than a distance between the bottom surface BS of the semiconductor substrate 10 and a relatively lower location and/or a relatively lower part in the second direction D2. The bottom or a lower portion of each component may be closer to the bottom surface BS of the semiconductor substrate 10 in the second direction D2 than the top or an upper portion of this component. Another component disposed above a specific component may be regarded as being relatively far from the bottom surface BS of the semiconductor substrate 10 in the second direction D2, and another component disposed under a specific component may be regarded as being relatively closer to the bottom surface BS of the semiconductor substrate 10 in the second direction D2. Additionally, in the above and/or subsequent descriptions, the top surface of a specific component may include the topmost surface of the specific component in the second direction D2, and the bottom surface of a specific component may include the bottommost surface of the specific component in the second direction D2.

Specifically, in some embodiments, the first portion 40A of the first oxide layer 40 may be directly connected with the second portion 40B, and the first portion 60A of the second oxide layer 60 may be directly connected with the second portion 60B. The second portion 40B of the first oxide layer 40 may be directly connected with the second portion 60B of the second oxide layer 60, the first portion 40A of the first oxide layer 40 may be separated from the first portion 60A of the second oxide layer 60, and a part of the gate structure 44 may be located between the first portion 40A of the first oxide layer 40 and the first portion 60A of the second oxide layer 60 in the second direction D2. In some embodiments, the first oxide layer 40 may be partially embedded in the semiconductor substrate 10. For example, a relatively lower part of the first portion 40A and a relatively lower part of the second portion 40B may be disposed in the semiconductor substrate 10, and a relatively upper part of the first portion 40A and a relatively upper part of the second portion 40B may be disposed above the semiconductor substrate 10. Therefore, a bottom surface BS1 of the first oxide layer 40 may be lower than the top surface TS of the semiconductor substrate 10 in the second direction D2, but not limited thereto. In addition, the first oxide layer 40 (such as the first portion 40A of the first oxide layer 40) may be disposed in only a part of the area between the gate structure 44 and the semiconductor substrate 10 in the second direction D2, and there may be not any first oxide layer 40 disposed in another part of the area between the gate structure 44 and the semiconductor substrate 10 (such as the left portion of the gate structure 44 shown in FIG. 1). Therefore, a top surface TS1 of the first portion 40A of the first oxide layer 40 may be higher than a bottom surface of the gate structure 44 (such as a bottom surface BS2 of the left portion of the gate structure 44 shown in FIG. 1) in the second direction D2. In some embodiments, the top surface of the gate structure 44 may be influenced by the first oxide layer and have an undulating surface correspondingly, and the first oxide layer 40 may be regarded as a step oxide layer, but not limited thereto. Additionally, in some embodiments, a part of the gate structure 44 (such as the right portion of the gate structure 44 shown in FIG. 1) may be disposed above the first portion 40A of the first oxide layer 40, the top surface TS1 of the first portion 40A of the first oxide layer 40 may be higher than a top surface TS2 of the second portion 40B of the first oxide layer 40 in the second direction D2 because of the influence of the process for forming the gate structure 44 (such as an etching process, but not limited thereto), and a thickness of the first portion 40A of the first oxide layer 40 (such as a distance between the top surface TS1 and the bottom surface BS1 in the second direction D2) may be greater than a thickness of the second portion 40B of the first oxide layer 40 (such as a distance between the top surface TS2 and the bottom surface BS1 in the second direction D2), but not limited thereto.

In some embodiments, the semiconductor substrate 10 may include a silicon substrate, an epitaxial silicon substrate, a silicon germanium substrate, a silicon carbide substrate, a silicon-on-insulator (SOI) substrate, or a substrate formed of other suitable semiconductor materials and/or other suitable structures. The first oxide layer 40 and the second oxide layer 60 may include silicon oxide or other suitable oxide materials respectively, and the material composition of the first oxide layer 40 may be identical to the material composition of the second oxide layer 60, but not limited thereto. In some embodiments, the first oxide layer 40 and the second oxide layer 60 having material compositions different from each other may also be applied according to some design considerations. The gate structure 44 may include non-metallic electrically conductive materials (such as doped polysilicon) or metal electrically conductive materials, such as a metal gate structure formed with a work function layer and a low electrical resistance layer stacked with each other, and the field plate 70 may include non-metallic electrically conductive materials (such as doped polysilicon) or metal electrically conductive materials. Therefore, in some embodiments, the material composition of the field plate 70 may be identical to the material composition of the gate structure 44 for simplifying related process steps (for example, required metal silicide layers may be formed concurrently on polysilicon when both of the field plate 70 and the gate structure 44 are formed with polysilicon, but not limited thereto). However, in some embodiments, the field plate 70 and the gate structure 44 having material compositions different from each other may also be applied according to some design considerations. Additionally, in some embodiments, the second oxide layer 60 and the field plate 70 may be formed concurrently by the same patterning process and have projection patterns substantially identical to each other and stacked with each other in the second direction D2, but not limited thereto. In some embodiments, a plurality of field plates 70 separated from one another may be disposed on the same second oxide layer 60 according to some design considerations.

In some embodiments, the semiconductor device 101 may further include a gate dielectric layer 42 and a spacer 46. The gate dielectric layer 42 may be disposed between the gate structure 44 and the semiconductor substrate 10, and the spacer 46 may be disposed on a sidewall of the gate structure 44. The gate dielectric layer 42 may include oxide (such as silicon oxide), high dielectric constant (high-k) materials, or other suitable dielectric materials. The high-k materials described above may include hafnium oxide (HfO$_x$), hafnium silicon oxide (HfSiO$_4$), hafnium silicon oxynitride (HfSiON), aluminum oxide (Al$_2$O$_3$), tantalum oxide (Ta$_2$O$_5$), zirconium oxide (ZrO$_2$), or other suitable high-k materials. Therefore, the material composition of the gate dielectric layer 42 may be identical to or different from the material composition of the first oxide layer 40 and the second oxide layer 60, and the thickness of the gate dielectric layer 42 may be less than the thickness of the first oxide layer 40 and the thickness of the second oxide layer 60. In some embodiments, a part of the gate dielectric layer 42 may be disposed between the first portion 40A of the first oxide layer 40 and the gate structure 44 in the second direction D2, and another part of the gate dielectric layer 42 and the drain region 52D may be disposed at two opposite sides of the first oxide layer 40 in the first direction D1 respectively, but not limited thereto. The spacer 46 may include a single layer or multiple layers of dielectric materials, such as silicon oxide, silicon nitride, silicon oxynitride, or other suitable dielectric materials. In some embodiments, a part of the spacer 46 may be disposed on the second portion 40B of the first oxide layer 40, and the part of the spacer 46 disposed on the second portion 40B of the first oxide layer 40 may be located between the second oxide layer 60 and the gate structure 44.

In some embodiments, the semiconductor device 101 may further include a deep well region 21, a deep well region 22, a doped well region 23, a doped well region 24, a doped well region 25, a drift region 26, an isolation structure 30, a doped region 54, a doped region 56, and a doped region 58. At least a part of the isolation structure 30 may be disposed in the semiconductor substrate 10 for defining a plurality of active areas (not shown in FIG. 1) in the semiconductor substrate 10, and the isolation structure 30 may include a single layer or multiple layers of insulation materials, such as oxide insulation materials (silicon oxide, for example) or other suitable insulation materials. The deep well region 21, the deep well region 22, the doped well region 23, the doped well region 24, the doped well region 25, and the drift region 26 may be disposed in the semiconductor substrate 10 and may be doped regions formed by doping processes (such as implantation processes) in the semiconductor substrate 10. The deep well region 22, the deep well region 23, and the doped well region 24 may be located above the deep well region 21, and the doped well region 25 and the drift region 26 may be located above the deep well region 22. In some embodiments, the conductivity type of the deep well region 22 may be complementary to the conductivity type of the deep well region 21, the conductivity type of the doped well region 23 may be complementary to the conductivity type of the deep well region 21, the conductivity type of the doped well region 24 may be identical to the conductivity type of the deep well region 21, the conductivity type of the doped well region 25 may be identical to the conductivity type of the deep well region 22, and the conductivity type of the drift region 26 may be complementary to the conductivity type of the doped well region 25, but not limited thereto. For example, when the semiconductor substrate 10 is a p-type semiconductor substrate or a semiconductor substrate including a p-type doped region, the deep well region 21 may be an n-type doped deep well region, the deep well region 22 may be a p-type doped deep well region, the doped well region 23 may be a p-type doped well region, the doped well region 24 may be an n-type doped well region, the doped well region 25 may be a p-type doped well region, and the drift region 26 may be an n-type doped region, but not limited thereto. In some embodiments, the semiconductor substrate 10, which is an n-type semiconductor substrate or a semiconductor substrate including an n-type doped region, may also be applied according to some design considerations, and the conductivities of the well regions and the doped regions may be adjusted correspondingly. In addition, when the first oxide layer is partially embedded in the semiconductor substrate 10, the drain region 52D and a part of the first oxide layer 40 (such as the lower part) may be located in the drift region 26, but not limited thereto.

In some embodiments, the doped region 24 and the source region 52S may be disposed in the doped well region 25, the drain region 52D may be disposed in the drift region 26, the doped region 56 may be disposed in the doped well region 23, and the doped region 58 may be disposed in the doped well region 24. The source region 52S, the drain region 52D, the doped region 54, the doped region 56, and the doped region 58 may be doped regions formed by doping processes (such as implantation processes) in the semiconductor substrate 10 respectively. For example, the source region 52S and the drain region 52D may be heavily doped regions having a conductivity type identical to that of the drift region 26 (such as n-type heavily doped regions), the doped region 54 may be a heavily doped region having a conductivity type identical to that of the doped well region 25 (such as a p-type heavily doped region), the doped region 56 may be a heavily doped region having a conductivity type identical to that of the doped well region 23 (such as a p-type heavily doped region), and the doped region 58 may be a heavily doped region having a conductivity type identical to that of the doped well region 24 (such as an n-type heavily doped region), but not limited thereto. In some embodiments, the doped region 54 may be used to control the electric potential of the doped well region 25, and the doped region 54 and the source region 52S may be regarded as a source doped region in the semiconductor device 101, but not limited thereto. In some embodiments, the gate structure 44, the gate dielectric layer 42, the first oxide layer 40, the second oxide layer 60, the field plate 70, the source region 52S, the drain region 52D, an the drift region 26 may constitute a high-voltage semiconductor device, the high-voltage semiconductor device may include a double-diffused metal-oxide-semiconductor (DMOS) device, such as a DMOS device in a Bipolar-CMOS-DMOS (BCD) structure, but not limited thereto. In addition, the doped well region 23, the doped well region 24, the doped region 56, and the doped region 58 may be used as parts in other semiconductor units, such as input/output (I/O) semiconductor units (not shown), but not limited thereto.

In some embodiments, the on-resistance of the semiconductor device 101 may be reduced by disposing the field plate 70 and the second oxide layer 60 and making the field plate 70 electrically connected with the gate structure 44, and the relatively thicker second oxide layer 60 may be used to further reduce the on-resistance and/or enhance the breakdown voltage of the semiconductor device 101. However, when manufacturing processes of other devices on the semiconductor substrate 10 (such as the manufacturing process of the BCD structure described above) have to be integrated with the manufacturing process of the semiconductor device 101, the second oxide layer 60 which is too thick may cause process problems in other areas. Therefore, the first oxide layer 40 may be used to compensate the thickness limitation of the second oxide layer 60, and the on-resistance of the semiconductor device 101 may be further reduced by the first oxide layer 40 with the thickness limitation of the second oxide layer 60. Additionally, compared with the condition where the first oxide layer 40 is disposed without disposing the second oxide layer 60 and the field plate 70 or the condition where the second oxide layer 60 and the field plate 70 are disposed without disposing the first oxide layer 40, the magnitude of the electric field generated on the surface of the semiconductor substrate 10 in the semiconductor device 101 may be reduced and the electric field distribution may become uniform by the disposition of the first oxide layer 40, the second oxide layer 60, and the field plate 70, and the related electrical performance of the semiconductor device 101 may be improved accordingly. Additionally, in some embodiments, the field plate 70 may be electrically connected with other parts according to some design considerations. For example, the field plate 70 may be electrically connected with the source region 52S for improving the gate-to-drain capacitance (Cgd) and reducing the gate charge of the semiconductor device 101, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 2:
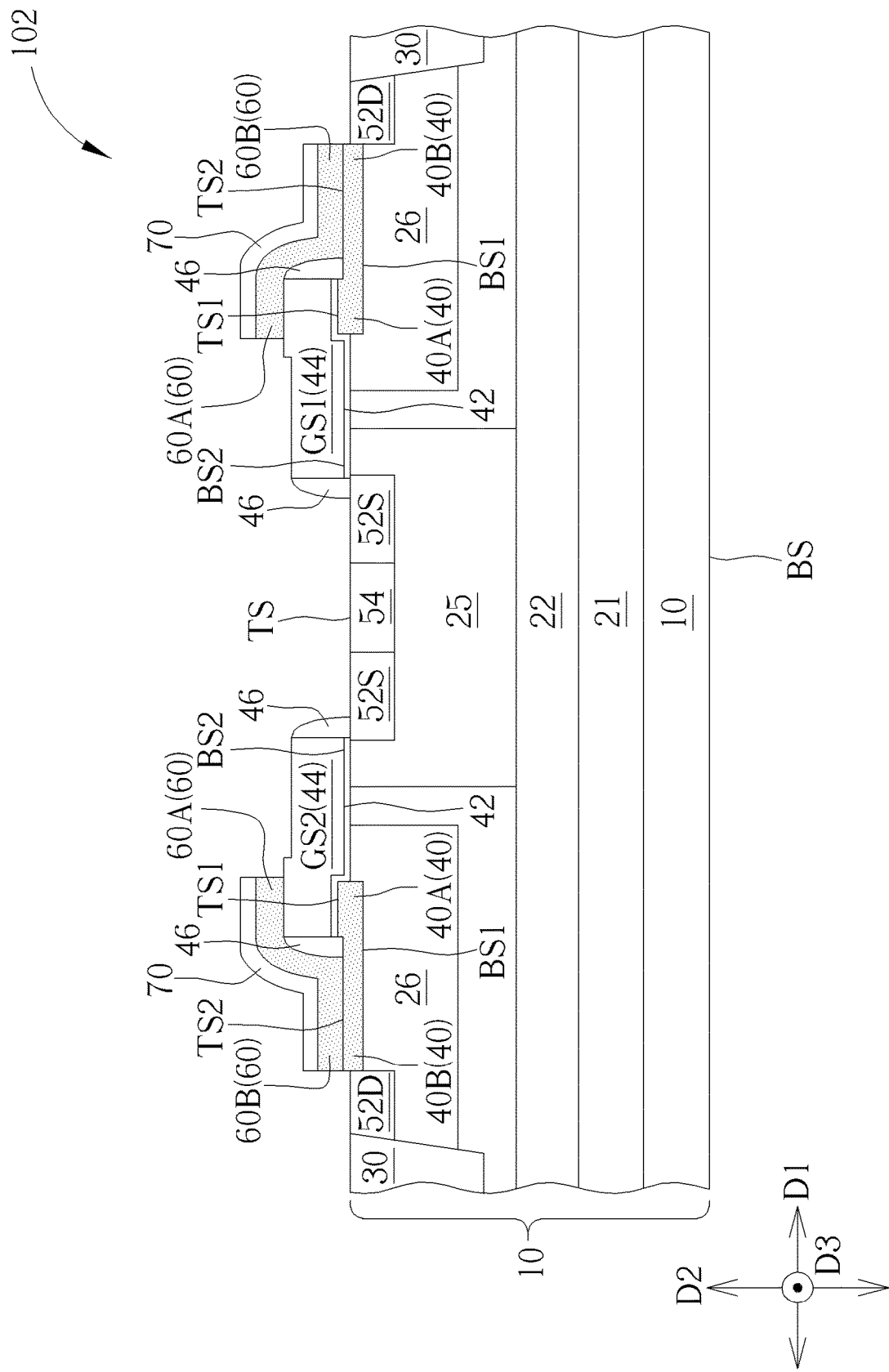
FIG. 2 is a schematic drawing illustrating a semiconductor device according to a second embodiment of the present invention.

Please refer to FIG. 2 and FIG. 1. FIG. 2 is a schematic drawing illustrating a semiconductor device 102 according to a second embodiment of the present invention. As shown in FIG. 2 and FIG. 1, the semiconductor device 102 may be formed with two semiconductor devices 101 in the first embodiment described above and disposed with mirror symmetry substantially, but not limited thereto. For example, the semiconductor device 102 may include two gate structures 44 (such as a first gate structure GS1 and a second gate structure GS2) disposed on the semiconductor substrate 10. The semiconductor device 102 may further include the drift region 26, the first oxide layer 40, the gate dielectric layer 42, the spacer 46, the source region 52S, the drain region 52D, the second oxide layer 60, and the field plate 70 disposed corresponding to the first gate structure GS1 for forming a transistor structure, and the semiconductor device 102 may further include the drift region 26, the first oxide layer 40, the gate dielectric layer 42, the spacer 46, the source region 52S, the drain region 52D, the second oxide layer 60, and the field plate 70 disposed corresponding to the second gate structure GS2 for forming another transistor structure. In some embodiments, the doped region 54 may be shared by the transistor structure including the first gate structure GS1 and the transistor structure including the second gate structure GS2, and the two drain regions 52D of the two transistor structures may be electrically connected with each other, but not limited thereto. In some embodiments, the transistor structure including the first gate structure GS1 and the transistor structure including the second gate structure GS2 may include a mirror symmetry symmetrical about the doped region 54 substantially, but not limited thereto. It is worth noting that the disposition approach where the two transistor structures are disposed with mirror symmetry in this embodiment may also be applied to other embodiments of the present invention according to some design considerations.

Figure 3:
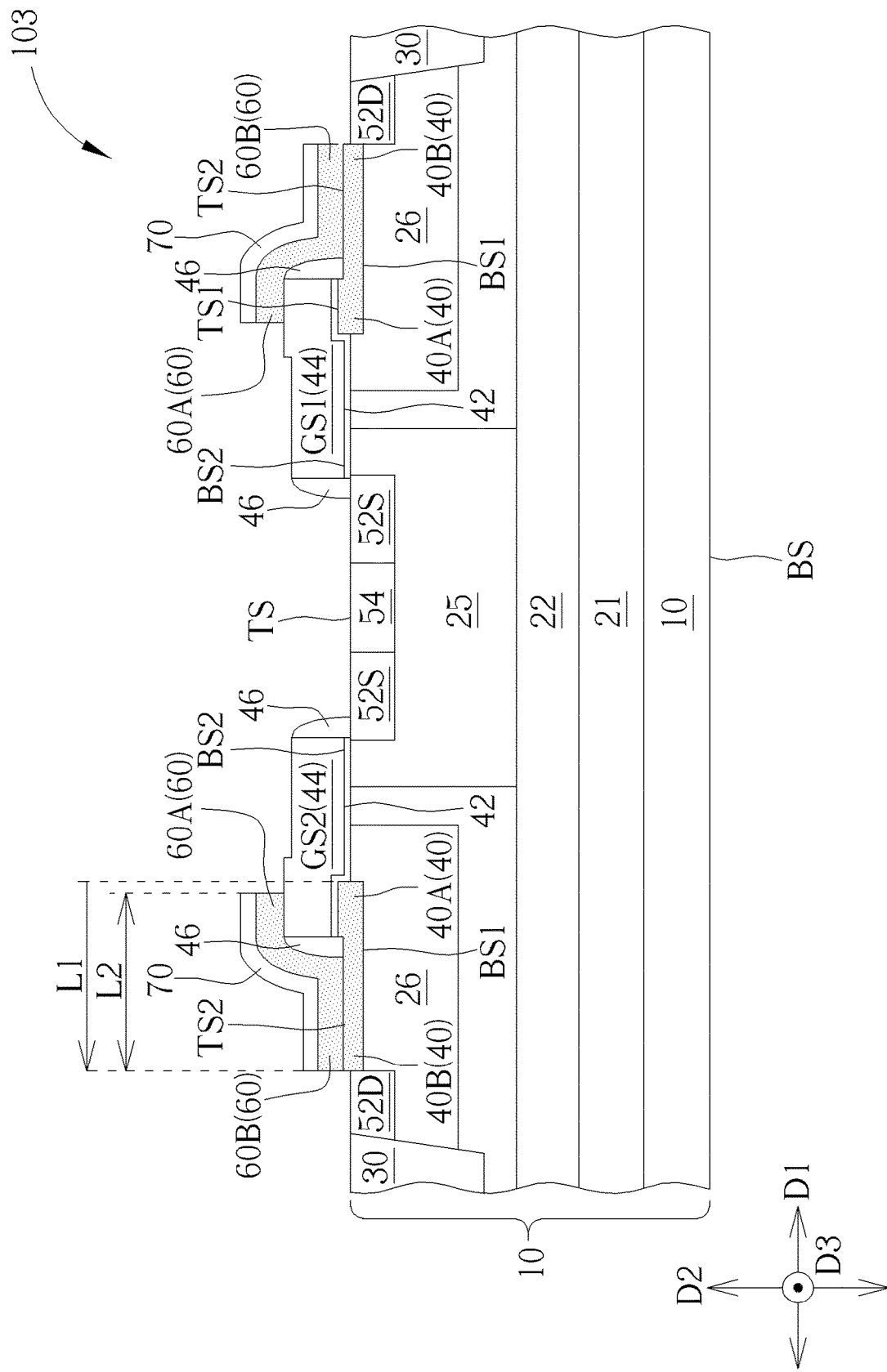
FIG. 3 is a schematic drawing illustrating a semiconductor device according to a third embodiment of the present invention.
Figure 4:
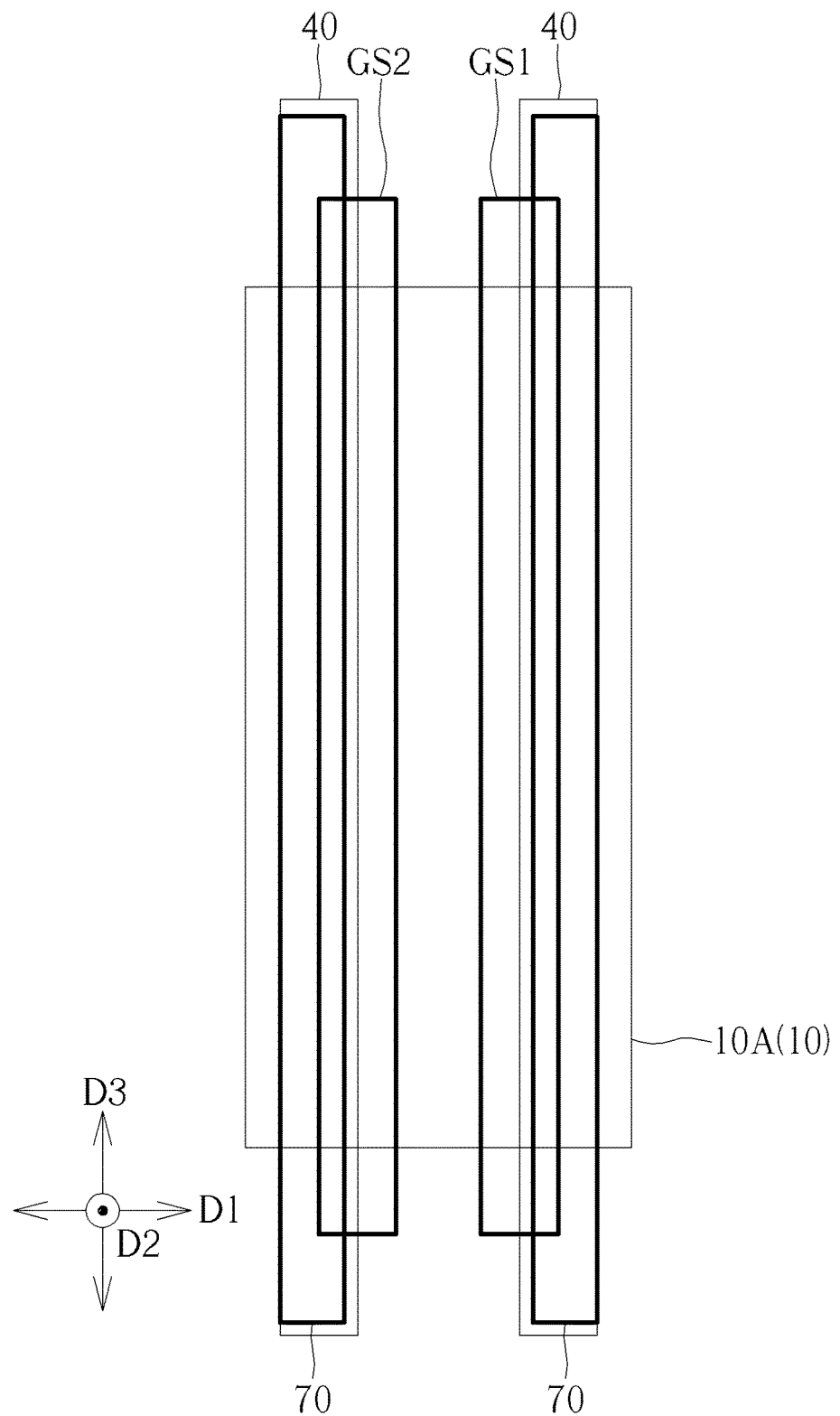
FIG. 4 is a schematic drawing illustrating a layout pattern of the semiconductor device according to the third embodiment of the present invention.

Please refer to FIG. 3 and FIG. 4. FIG. 3 is a schematic drawing illustrating a semiconductor device 103 according to a third embodiment of the present invention. FIG. 4 is a schematic drawing illustrating a layout pattern of the semiconductor device in this embodiment, and some parts in the semiconductor device 103 (such as the second oxide layer, the source region, the drain region, the doped regions, the well regions, the isolation structure, the spacer, the gate dielectric layer, and so forth) are not illustrated in FIG. 4. As shown in FIG. 3 and FIG. 4, in some embodiments, a length L1 of the first oxide layer 40 in the first direction D1 may be greater than a length L2 of the second oxide layer 60 in the first direction D1, especially when relatively more first portion 40A of the first oxide layer 40 is required for enhancing the voltage endurance and the influence of the field plate 70 on the electric field has to be reduced, but not limited thereto. Additionally, in some embodiments, the first gate structure GS1, the second gate structure GS2, the first oxide layer 40, and the field plate 70 may be elongated in the third direction D3 respectively. In the third direction D3, the length of the first gate structure GS1, the length of the second gate structure GS2, the length of the first oxide layer 40, and the length of the field plate 70 may be respectively greater than the length of an active area 10A surrounded by the isolation structure 30 in the semiconductor substrate 10, but not limited thereto. It is worth noting that the relative thickness relationship between the first oxide layer 40 and the second oxide layer 60 in this embodiment may also be applied to other embodiments of the present invention according to some design considerations.

Figure 5:
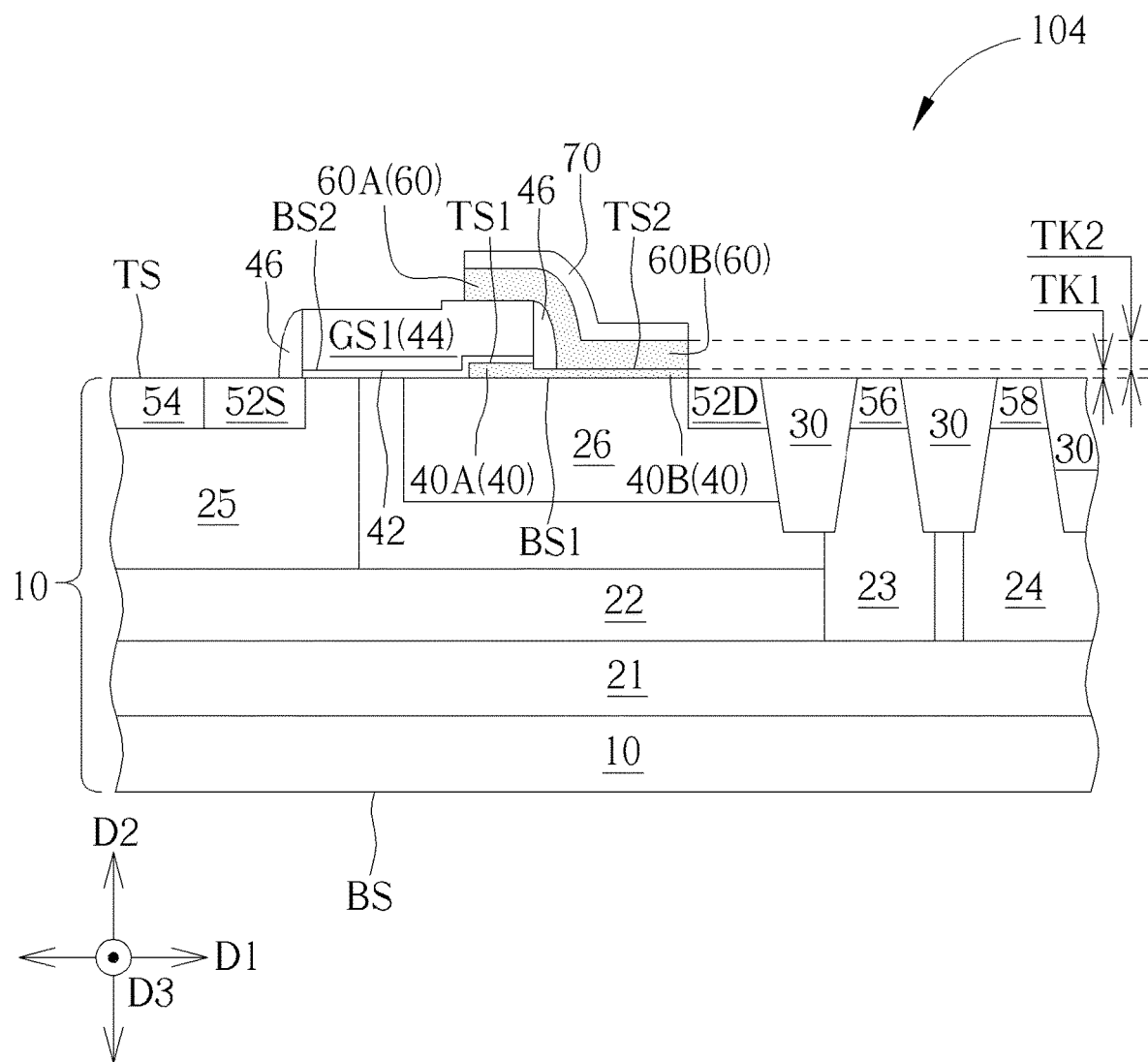
FIG. 5 is a schematic drawing illustrating a semiconductor device according to a fourth embodiment of the present invention.

Please refer to FIG. 5. FIG. 5 is a schematic drawing illustrating a semiconductor device 104 according to a fourth embodiment of the present invention. As shown in FIG. 5, in some embodiments, the first oxide layer 40 may be disposed on the semiconductor substrate 10 without being partly embedded in the semiconductor substrate 10. In this situation, for reducing the negative influence of the thickness of the first oxide layer 40 on other parts (such as the gate structure 44), the first oxide layer 40 may be relatively thinner, and a thickness TK2 of the second oxide layer 60 may be greater than a thickness of the first oxide layer 40 (such as a thickness of the first portion 40A and a thickness TK1 of the second portion 40B), but not limited thereto. It is worth noting that the relative thickness relationship between the first oxide layer 40 and the second oxide layer 60 in this embodiment may also be applied to other embodiments of the present invention according to some design considerations.

Figure 6:
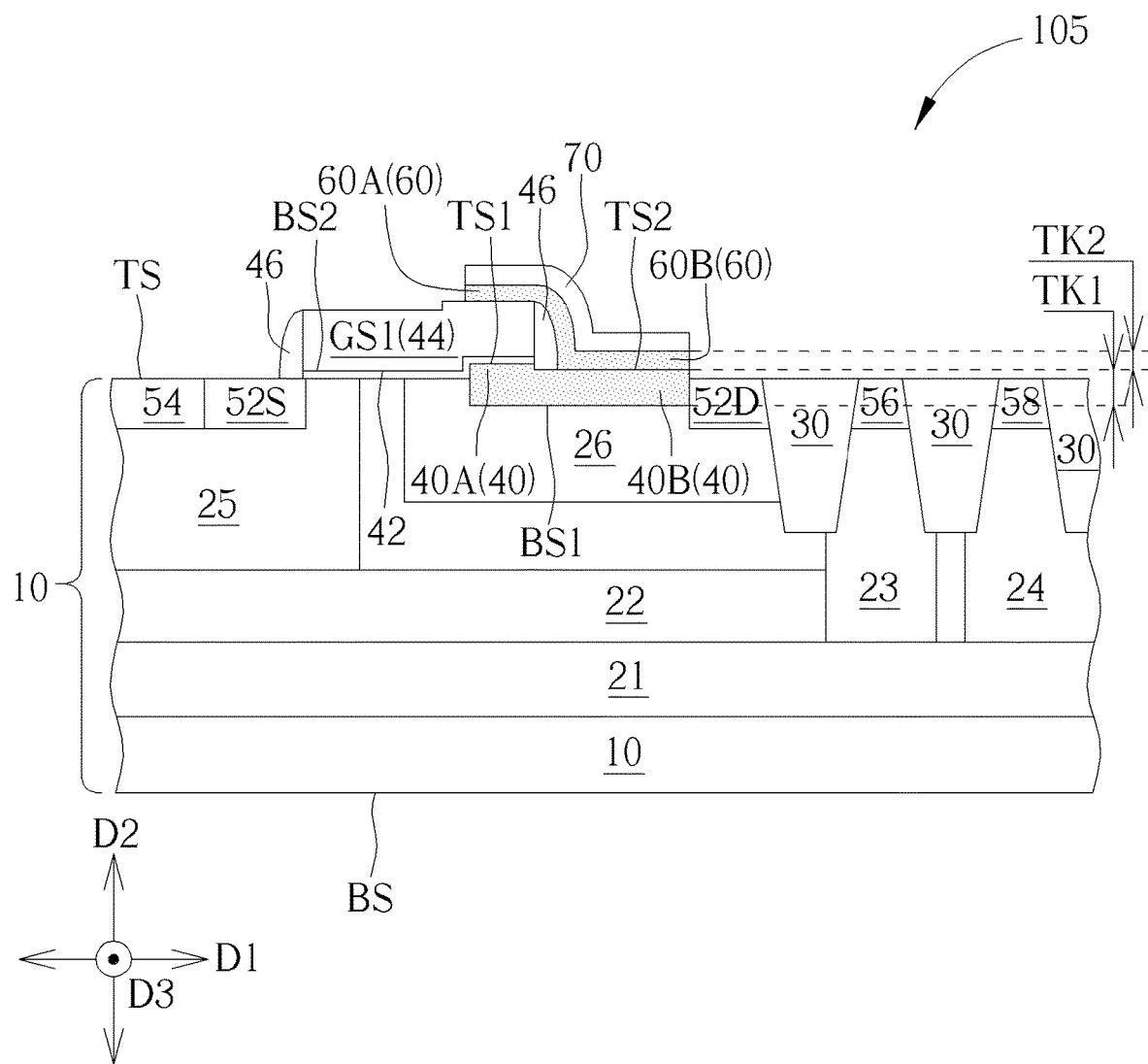
FIG. 6 is a schematic drawing illustrating a semiconductor device according to a fifth embodiment of the present invention.

Please refer to FIG. 6. FIG. 6 is a schematic drawing illustrating a semiconductor device 105 according to a fifth embodiment of the present invention. As shown in FIG. 6, in some embodiments, the thickness of the second oxide layer 60 may be relatively reduced by the first oxide layer 40 partially embedded in the semiconductor substrate 10 and increasing the thickness of the first oxide layer 40 for reducing the chance of process problems that may be caused by the second oxide layer 60, and the thickness of the first oxide layer 40 (such as the thickness of the first portion 40A and the thickness TK1 of the second portion 40B) may be greater than the thickness TK2 of the second oxide layer 60 accordingly, but not limited thereto. It is worth noting that the relative thickness relationship between the first oxide layer 40 and the second oxide layer 60 in this embodiment may also be applied to other embodiments of the present invention according to some design considerations.

Figure 7:
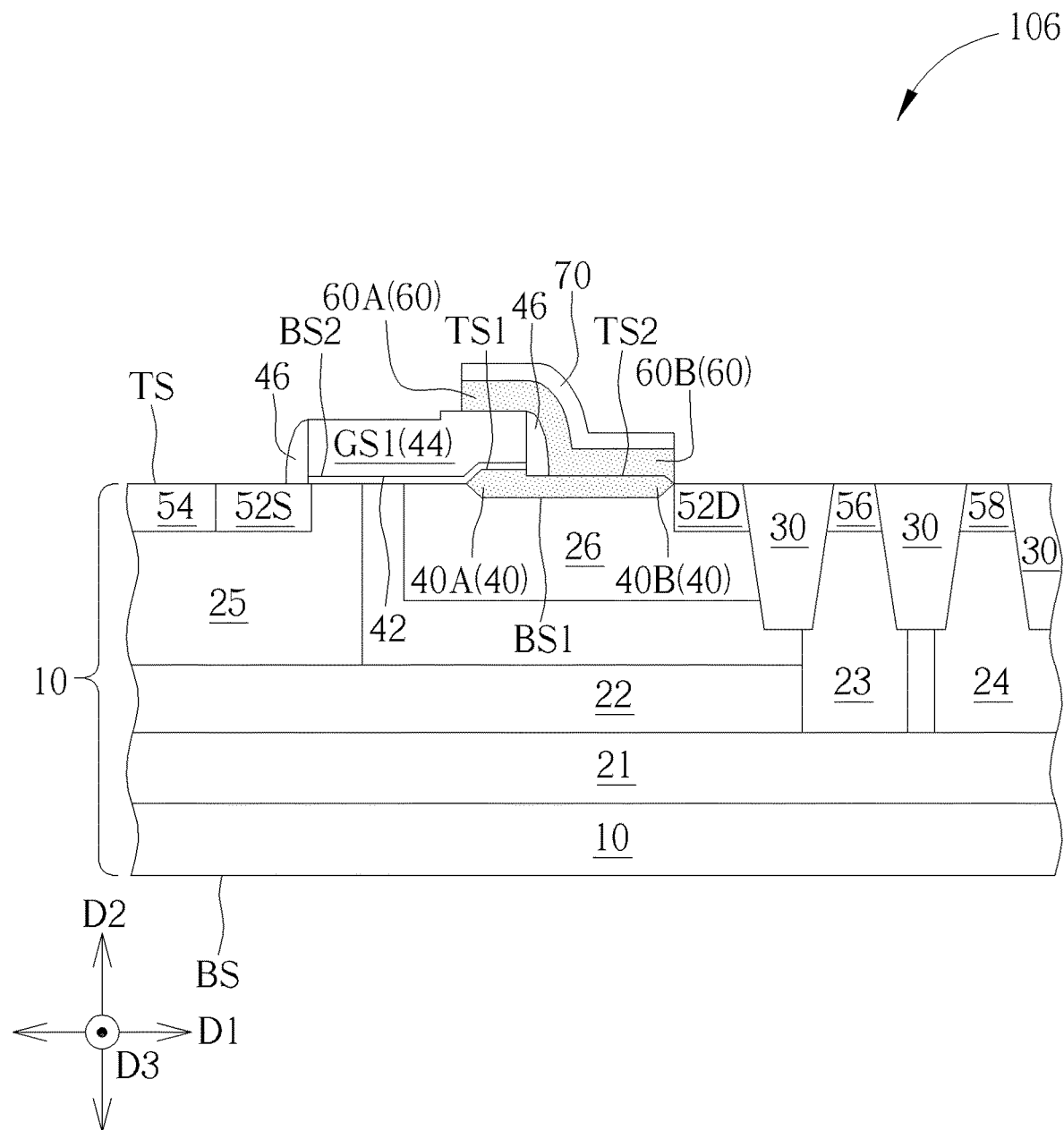
FIG. 7 is a schematic drawing illustrating a semiconductor device according to a sixth embodiment of the present invention.

Please refer to FIG. 7. FIG. 7 is a schematic drawing illustrating a semiconductor device 106 according to a sixth embodiment of the present invention. As shown in FIG. 7, in some embodiments, the first oxide layer 40 may include a local oxide structure, such as a local oxidation of silicon (LOCOS) structure, and the thickness of the first oxide layer 40 may be gradually increased from two opposite edges of the first oxide layer 40 in the horizontal direction (such as the first direction D1) towards the center part of the first oxide layer 40, but not limited thereto. It is worth noting that the structure of the first oxide layer 40 in this embodiment may also be applied to other embodiments of the present invention according to some design considerations.

Figure 8:
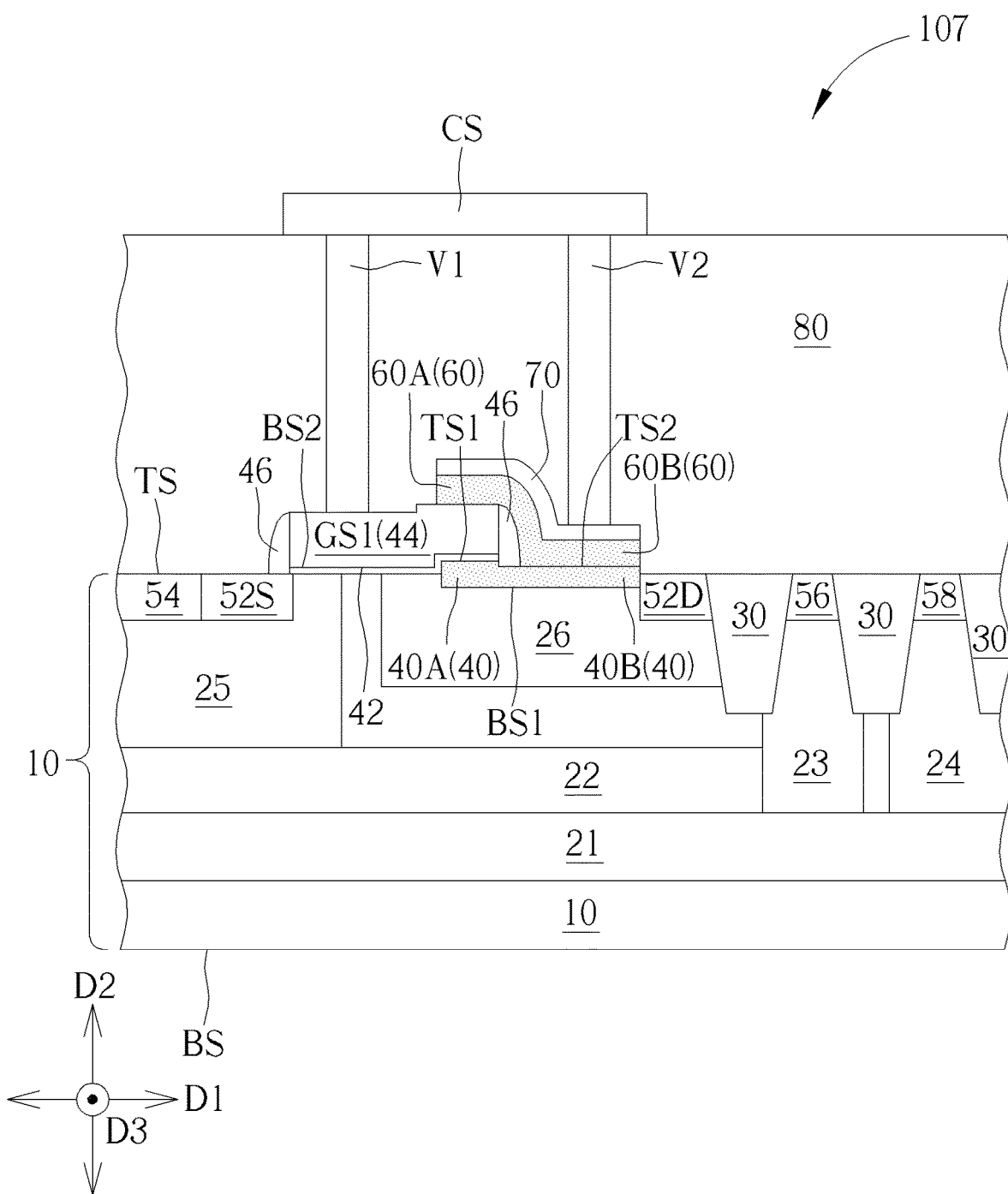
FIG. 8 is a schematic drawing illustrating a semiconductor device according to a seventh embodiment of the present invention.

Please refer to FIG. 8. FIG. 8 is a schematic drawing illustrating a semiconductor device 107 according to a seventh embodiment of the present invention. As shown in FIG. 8, in some embodiments, the semiconductor device 107 may further include an interlayer dielectric layer 80, a contact structure V1, a contact structure V2, and a connection structure CS. The interlayer dielectric layer 80 may be disposed on the semiconductor substrate 10 and cover the gate structure 44 and the field plate 70, the contact structure V1 and the contact structure V2 may penetrate through the interlayer dielectric layer 80 and be electrically connected with the gate structure 44 and the field plate 70 respectively, and the connection structure CS may be disposed on the interlayer dielectric layer 80 and electrically connected with the gate structure 44 and the field plate 70. Therefore, the field plate 70 may be electrically connected with the gate structure 44 via the contact structure V2, the connection structure CS, and the contact structure V1, but not limited thereto. In some embodiments, the field plate 70 may be electrically connected with other parts by other approaches and/or other structures according to some design considerations. In addition, the interlayer dielectric layer 80 may include a single layer or multiple layers of dielectric materials, such as silicon oxide, silicon nitride, silicon oxynitride, or other suitable dielectric materials, and the contact structure V1, the contact structure V2, and the connection structure CS may include a barrier layer and a low resistivity material disposed on the barrier layer, respectively, but not limited thereto. The barrier layer described above may include titanium nitride, tantalum nitride, or other suitable barrier materials, and the low resistivity material described above may include a material having relatively lower electrical resistivity, such as copper, aluminum, tungsten, and so forth, but not limited thereto. Additionally, in some embodiments, metal silicide layers (not shown) may be disposed between the contact structure V1 and the gate structure 44 and be disposed between the contact structure V2 and the field plate 70, respectively, for improving the electrical connection between the contact structure V1 and the gate structure 44 and the electrical connection between the contact structure V2 and the field plate 70, but not limited thereto. It is worth noting that the structure configured for electrically connecting the field plate 70 and other parts in this embodiment may also be applied to other embodiments of the present invention according to some design considerations.

To summarize the above descriptions, according to the semiconductor device in the present invention, the first oxide layer may be disposed under the gate structure, and the second oxide layer and the field plate may be disposed above the gate structure for reducing the on-resistance of the semiconductor device, modifying the electric field distribution, and improving the related electrical performance of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
  a semiconductor substrate;
  a gate structure disposed on the semiconductor substrate;
  a source region and a drain region disposed in the semiconductor substrate and located at two opposite sides of the gate structure in a horizontal direction respectively;
  a first oxide layer comprising:
    a first portion disposed between the gate structure and the semiconductor substrate in a vertical direction; and
    a second portion disposed between the gate structure and the drain region,
      wherein a topmost surface of the first portion of the first oxide layer is higher than a topmost surface of the second portion of the first oxide layer in the vertical direction;
  a field plate partly disposed above the gate structure and partly disposed above the second portion of the first oxide layer; and
  a second oxide layer comprising:
    a first portion disposed between the field plate and the gate structure in the vertical direction, wherein the first portion of the second oxide layer is disposed above the gate structure in the vertical direction; and a second portion disposed between the field plate and the second portion of the first oxide layer in the vertical direction.

2. The semiconductor device according to claim 1, wherein the topmost surface of the first portion of the first oxide layer is higher than a bottom surface of the gate structure in the vertical direction.

3. The semiconductor device according to claim 1, wherein a thickness of the first portion of the first oxide layer is greater than a thickness of the second portion of the first oxide layer.

4. The semiconductor device according to claim 1, wherein a bottom surface of the first oxide layer is lower than a top surface of the semiconductor substrate in the vertical direction.

5. The semiconductor device according to claim 1, wherein the first oxide layer is partially embedded in the semiconductor substrate.

6. The semiconductor device according to claim 1, wherein the second portion of the first oxide layer is directly connected with the second portion of the second oxide layer.

7. The semiconductor device according to claim 1, further comprising:
a gate dielectric layer disposed between the gate structure and the semiconductor substrate.

8. The semiconductor device according to claim 7, wherein a part of the gate dielectric layer is disposed between the first portion of the first oxide layer and the gate structure in the vertical direction.

9. The semiconductor device according to claim 7, wherein a part of the gate dielectric layer and the drain region are disposed at two opposite sides of the first oxide layer in the horizontal direction respectively.

10. The semiconductor device according to claim 1, wherein a part of the gate structure is disposed between the first portion of the second oxide layer and the first portion of the first oxide layer in the vertical direction.

11. The semiconductor device according to claim 1, wherein a thickness of the second oxide layer is greater than a thickness of the first oxide layer.

12. The semiconductor device according to claim 1, wherein a thickness of the first oxide layer is greater than a thickness of the second oxide layer.

13. The semiconductor device according to claim 1, further comprising:
a spacer disposed on a sidewall of the gate structure, wherein a part of the spacer is disposed on the second portion of the first oxide layer.

14. The semiconductor device according to claim 13, wherein the part of the spacer disposed on the second portion of the first oxide layer is located between the second oxide layer and the gate structure.

15. The semiconductor device according to claim 1, further comprising:
a drift region disposed in the semiconductor substrate, wherein the drain region and a part of the first oxide layer are located in the drift region.

16. The semiconductor device according to claim 1, wherein a length of the first oxide layer in the horizontal direction is greater than a length of the second oxide layer in the horizontal direction.

17. The semiconductor device according to claim 1, wherein the field plate is electrically connected with the gate structure.

18. The semiconductor device according to claim 1, wherein a material composition of the first oxide layer is identical to a material composition of the second oxide layer.

19. The semiconductor device according to claim 1, wherein a material composition of the field plate is identical to a material composition of the gate structure.

* * * * *